(12) United States Patent
Aliseychik et al.

(10) Patent No.: US 9,124,297 B2
(45) Date of Patent: Sep. 1, 2015

(54) TRAPPING-SET DATABASE FOR A LOW-DENSITY PARITY-CHECK DECODER

(71) Applicant: LSI Corporation, San Jose, CA (US)

(72) Inventors: Pavel Aleksandrovich Aliseychik, Moscow (RU); Denis Vasilevich Parfenov, Moscow (RU); Alexander Nikolaevich Filippov, Moskow (RU); Alexander Alexandrovich Petyushko, Moscow (RU); Denis Vladimirovich Parkhomenko, Moscow (RU)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 80 days.

(21) Appl. No.: 13/915,823

(22) Filed: Jun. 12, 2013

(65) Prior Publication Data

US 2014/0122960 A1    May 1, 2014

(30) Foreign Application Priority Data

Nov. 1, 2012 (RU) .............................. 2012146685

(51) Int. Cl.
*H04L 1/00* (2006.01)
*H03M 13/11* (2006.01)

(52) U.S. Cl.
CPC ............................... *H03M 13/1142* (2013.01)

(58) Field of Classification Search
CPC ........................................................ H04L 1/0057
USPC ................................. 714/752, 773, 759, 780
See application file for complete search history.

(56) References Cited

U.S. PATENT DOCUMENTS

| | | |
|---|---|---|
| 3,755,779 A | 8/1973 | Price |
| 4,295,218 A | 10/1981 | Tanner |
| 5,048,060 A | 9/1991 | Arai et al. |
| 5,721,745 A | 2/1998 | Hladik et al. |
| 5,734,962 A | 3/1998 | Hladik et al. |
| 5,757,795 A | 5/1998 | Schnell |

(Continued)

FOREIGN PATENT DOCUMENTS

| | | |
|---|---|---|
| CN | 101174838 A | 5/2008 |
| CN | 101174839 A | 5/2008 |

(Continued)

OTHER PUBLICATIONS

Chen, J., et al., "Density Evolution for Two Improved BP-Based Decoding Algorithms of LDPC Codes," Communications Letters, IEEE, May 2002, vol. 6, No. 5, pp. 208-210.

(Continued)

*Primary Examiner* — Fritz Alphonse
(74) *Attorney, Agent, or Firm* — Hamilton DeSanctis & Cha (57) ABSTRACT

A machine-implemented method of generating trapping-set information for use in LDPC-decoding processing of read signals generated, e.g., by sensing a storage medium, such as a magnetic platter. In one embodiment, the method can be implemented as an add-on to any other trapping-set search method in which the discovered trapping sets are evaluated to determine their influence on the overall bit-error rate and/or error-floor characteristics of the LDPC decoder. The method can advantageously reuse at least some of the computational results obtained during this evaluation, thereby requiring a relatively small amount of additional computations, while providing a significant benefit of discovering many more trapping sets in addition to the ones that are being evaluated.

20 Claims, 5 Drawing Sheets

(56) References Cited

U.S. PATENT DOCUMENTS

| | | | |
|---|---|---|---|
| 5,768,270 A | 6/1998 | Ha-Duong |
| 6,023,783 A | 2/2000 | Divsalar et al. |
| 6,236,686 B1 | 5/2001 | Kamishima |
| 6,307,901 B1 | 10/2001 | Yu et al. |
| 6,550,023 B1 | 4/2003 | Brauch et al. |
| 6,678,843 B2 | 1/2004 | Giulietti et al. |
| 6,745,157 B1 | 6/2004 | Weiss et al. |
| 6,760,879 B2 | 7/2004 | Giese et al. |
| 6,888,897 B1 | 5/2005 | Nazari et al. |
| 6,910,000 B1 | 6/2005 | Yedidia et al. |
| 7,143,333 B2 | 11/2006 | Blankenship et al. |
| 7,181,676 B2 | 2/2007 | Hocevar |
| 7,219,288 B2 | 5/2007 | Dielissen et al. |
| 7,237,181 B2 | 6/2007 | Richardson |
| 7,284,164 B2 | 10/2007 | Yoshida |
| 7,296,216 B2 | 11/2007 | Shen et al. |
| 7,340,671 B2 | 3/2008 | Jones et al. |
| 7,353,444 B2 | 4/2008 | Owsley et al. |
| 7,373,581 B2 | 5/2008 | Okamura et al. |
| 7,457,367 B2 | 11/2008 | Farhang-Boroujeny et al. |
| 7,689,888 B2 | 3/2010 | Kan et al. |
| 7,725,800 B2 | 5/2010 | Yang et al. |
| 7,730,377 B2 | 6/2010 | Hocevar |
| 7,739,558 B1 | 6/2010 | Farjadrad et al. |
| 7,752,523 B1 | 7/2010 | Chaichanavong et al. |
| 7,805,642 B1 | 9/2010 | Farjadrad |
| 7,809,089 B2 | 10/2010 | Kuroyanagi et al. |
| 7,895,500 B2 | 2/2011 | Sun et al. |
| 7,904,793 B2 | 3/2011 | Mokhlesi et al. |
| 7,941,737 B2 | 5/2011 | Gopalakrishnan et al. |
| 7,949,927 B2 | 5/2011 | Park et al. |
| 8,010,869 B2 | 8/2011 | Wejn et al. |
| 8,020,070 B2 | 9/2011 | Langner et al. |
| 8,037,394 B2 | 10/2011 | Djurdjevic et al. |
| 8,046,658 B2 | 10/2011 | Heinrich et al. |
| 8,051,363 B1 | 11/2011 | Liu |
| 8,103,931 B2 | 1/2012 | Wang et al. |
| 8,127,209 B1 | 2/2012 | Zhang et al. |
| 8,151,171 B2 | 4/2012 | Blanksby |
| 8,156,409 B2 | 4/2012 | Patapoutian et al. |
| 8,161,345 B2 | 4/2012 | Graef |
| 8,171,367 B2 | 5/2012 | Gao et al. |
| 8,205,134 B2 | 6/2012 | Harrison et al. |
| 8,205,144 B1 | 6/2012 | Yadav |
| 8,213,342 B2 | 7/2012 | Haruna et al. |
| 8,214,719 B1 | 7/2012 | Sheng et al. |
| 8,219,878 B1 | 7/2012 | Varnica et al. |
| 8,255,763 B1 | 8/2012 | Yang et al. |
| 8,301,984 B1 | 10/2012 | Zhang et al. |
| 8,307,253 B2 | 11/2012 | Gunnam |
| 8,327,235 B2 | 12/2012 | Gunnam |
| 8,407,567 B2 | 3/2013 | Gunnam |
| 8,468,429 B2 | 6/2013 | Gunnam |
| 8,683,299 B2 * | 3/2014 | Gunnam et al. ............ 714/774 |
| 8,700,976 B2 * | 4/2014 | Gunnam et al. ............ 714/774 |
| 2002/0062468 A1 | 5/2002 | Nagase et al. |
| 2002/0166095 A1 | 11/2002 | Lavi et al. |
| 2005/0132260 A1 | 6/2005 | Kyung et al. |
| 2005/0193320 A1 | 9/2005 | Varnica et al. |
| 2005/0204255 A1 | 9/2005 | Yeh et al. |
| 2005/0204264 A1 | 9/2005 | Yusa |
| 2005/0283707 A1 | 12/2005 | Sharon et al. |
| 2006/0013306 A1 | 1/2006 | Kim et al. |
| 2006/0036928 A1 | 2/2006 | Eroz et al. |
| 2006/0107181 A1 | 5/2006 | Dave et al. |
| 2006/0115802 A1 | 6/2006 | Reynolds |
| 2006/0285852 A1 | 12/2006 | Xi et al. |
| 2007/0011569 A1 | 1/2007 | Vila Casado et al. |
| 2007/0011573 A1 | 1/2007 | Farjadrad et al. |
| 2007/0011586 A1 | 1/2007 | Belogolovyi et al. |
| 2007/0044006 A1 | 2/2007 | Yang et al. |
| 2007/0071009 A1 | 3/2007 | Nagaraj et al. |
| 2007/0089018 A1 | 4/2007 | Tang et al. |
| 2007/0089019 A1 | 4/2007 | Tang et al. |
| 2007/0124652 A1 | 5/2007 | Litsyn et al. |
| 2007/0147481 A1 | 6/2007 | Bottomley et al. |
| 2007/0153943 A1 | 7/2007 | Nissila |
| 2007/0162788 A1 | 7/2007 | Moelker |
| 2007/0220408 A1 | 9/2007 | Huggett et al. |
| 2007/0234178 A1 | 10/2007 | Richardson et al. |
| 2007/0234184 A1 | 10/2007 | Richardson |
| 2008/0049869 A1 | 2/2008 | Heinrich et al. |
| 2008/0082868 A1 | 4/2008 | Tran et al. |
| 2008/0104460 A1 | 5/2008 | Kanaoka |
| 2008/0104485 A1 | 5/2008 | Lyakh et al. |
| 2008/0109701 A1 | 5/2008 | Yu et al. |
| 2008/0126910 A1 | 5/2008 | Venkatesan et al. |
| 2008/0148129 A1 | 6/2008 | Moon et al. |
| 2008/0163032 A1 | 7/2008 | Lastras-Montano |
| 2008/0235561 A1 | 9/2008 | Yang |
| 2008/0276156 A1 | 11/2008 | Gunnam et al. |
| 2008/0301517 A1 | 12/2008 | Zhong |
| 2008/0301521 A1 | 12/2008 | Gunnam et al. |
| 2009/0019338 A1 | 1/2009 | Obuchi et al. |
| 2009/0063931 A1 | 3/2009 | Rovini et al. |
| 2009/0083609 A1 | 3/2009 | Yue et al. |
| 2009/0132897 A1 | 5/2009 | Xu et al. |
| 2009/0150745 A1 | 6/2009 | Langner et al. |
| 2009/0235146 A1 | 9/2009 | Tan et al. |
| 2009/0259912 A1 | 10/2009 | Djordjevic et al. |
| 2009/0273492 A1 | 11/2009 | Yang et al. |
| 2009/0307566 A1 | 12/2009 | No et al. |
| 2009/0319860 A1 | 12/2009 | Sharon et al. |
| 2010/0037121 A1 | 2/2010 | Jin et al. |
| 2010/0042806 A1 | 2/2010 | Gunnam |
| 2010/0042890 A1 | 2/2010 | Gunnam |
| 2010/0042892 A1 | 2/2010 | Gunnam |
| 2010/0042893 A1 | 2/2010 | Gunnam |
| 2010/0042898 A1 | 2/2010 | Gunnam |
| 2010/0042902 A1 | 2/2010 | Gunnam |
| 2010/0042903 A1 | 2/2010 | Gunnam |
| 2010/0050043 A1 | 2/2010 | Savin |
| 2010/0058152 A1 | 3/2010 | Harada |
| 2010/0088575 A1 | 4/2010 | Sharon et al. |
| 2011/0041029 A1 | 2/2011 | Yedidia et al. |
| 2012/0135285 A1 | 5/2012 | Iwama et al. |
| 2012/0139074 A1 | 6/2012 | Abe |
| 2013/0124590 A1 | 5/2013 | Gunnam et al. |

FOREIGN PATENT DOCUMENTS

| | | |
|---|---|---|
| EP | 1926102 A1 | 5/2008 |
| EP | 1926142 A1 | 5/2008 |
| JP | 2001251384 A | 9/2001 |
| JP | 2004005854 A | 1/2004 |
| JP | 2005020505 A | 1/2005 |
| JP | 2005500513 A | 1/2005 |
| JP | 2007036495 A | 11/2007 |
| JP | 2008112516 A | 5/2008 |
| JP | 2009100222 A | 5/2009 |
| TW | 200814544 A | 3/2008 |
| WO | WO03092170 A1 | 11/2003 |
| WO | WO2004079563 A1 | 9/2004 |
| WO | WO2008004215 A2 | 1/2008 |
| WO | WO 2010/019168 A1 | 2/2010 |
| WO | WO2010101578 A1 | 9/2010 |

OTHER PUBLICATIONS

Chen, J., et al., "Near Optimum Universal Belief Propagation Based Decoding of Low-Density Parity Check Codes," IEEE Transations on Communications Letters, Mar. 2002, vol. 50, No. 3, pp. 406-414.

Karkooti, M., et al., "Semi-Parallel Reconfigurable Architectures for Real-Time LDPC Decoding," Information International Conference on Technology: Coding and Computing Proceedings, Apr. 2004, vol. 1, pp. 579-585.

Tzu-chieh, K., "Flexible Decoder Architectures for Irregular QC-LDPC Code," 51st Midwest Symposium on Circuits and Systems, Aug. 10-13, 2008, pp. 229-232.

Notification of the Second Office Action; Jun. 27, 2014 for the corresponding CN Application No. 200980100343.2.

(56) References Cited

OTHER PUBLICATIONS

Kang, J., et al., "A Two-Stage Iterative Decoding of LDPC Codes for Lowering Error Floors," IEEE Global Telecommunications Conference, 2008, pp. 1-4.
Sharon, E, et al., "An Efficient Message-Passing Schedule for LDPC Decoding," 2004, XP002713218, Retrieved from http://www.eng.biu.ac.il/goldbej/papers/engisreal.pdf on Sep. 19, 2013, 4 pages.
Pusane, A.E.; Costello, D.J.; Mitchell, D.G.M;, "Trapping Set Analysis of Protograph-Based LDPC Convolutional Codes," Information Theory, 2009. ISIT 2009. IEEE International Symposium on, vol., No., pp. 561-565, Jun. 28, 2009-Jul. 3, 2009.
Laendner, S.; Milenkovic, O.;, "LDPC Codes Based on Latin Squares: Cycle Structure, Stopping Set, and Trapping Set Analysis," Communications, IEEE Transactions on, vol. 55, No. 2, pp. 303-312, Feb. 2007.
Dehkordi, M.K,; Banihashemi, A.H.;, "An Efficient Algorithm for Finding Dominant Trapping Sets of LDPC Codes," Turbo Codes and Iterative Information Processing (ISTC), 2010 6th International Symposium on, pp. 444-448, Sep. 6-10, 2010.
D. MacKay and M. Postol, "Weaknesses of margulis and ramanujan-margulis low- density parity-check codes," Electronic Notes in Theoretical Computer Science, vol. 74, 2003.
B. Xia and W. E. Ryan, "On importance sampling for linear block codes," Proc. 2003 IEEE International Conference on Communications, vol. 4, pp. 2904-2908, May 2003.
L. Dolecek, Z. Zhang, M. Wainwright, V. Anantharam, and B. Nikoli'c, "Evaluation of the low frame error rate performance of LDPC codes using importance sampling," 2007 IEEE Inform. Theory Workshop, Sep. 2-6, 2007.
Matsuoka, K., et al., "Improvement of Turbo Equalization with LDPC Code," IEICE Transaction, Apr. 1, 2007, vol. J90-B, No. 4, pp. 432-436 with partial English translation.
Lee, M.K., et al., "Adaptive Turbo Equalizer with Stopping Rule Based on LDPC Codes," ISIT, 2009, pp. 928-932.
K. Gunnam "Area and Energy Efficient VLSI Architectures for Low-Density Parity-Check Decoders Using an On-The-Fly Computation" dissertation at Texas A&M University, Dec. 2006.
Cavus, E., et al., "Low BER performance estimation of LDPC codes via application of importance sampling to trapping sets," IEEE Transactions on Communications, vol. 57, No. 7, pp. 1886-1888, Jul. 2009.
Koetter, R., et al. "Turbo equalization," Signal Processing Magazine, IEEE , vol. 21, No. 1, pp. 67-80, Jan. 2004.
Ryan, W. E., et al., "Channel Codes: Classical and Modern," Cambridge University Press, 2009, 710 pages.
Casado, V., et al., "Informed Dynamic Scheduling for Belief-Propagation Decoding of LDPC Codes," IEEE International Conference on Communications, Jun. 24-28, 2007, pp. 932-937.
Presman, N., et al., "Efficient Layers-based Schedules for Iterative Decoding of LDPC Codes," IEEE International Symposium on Information Theory, Jul. 6-11, 2008, pp. 1148-1152.
Radosavljevic, P., et al., "Optimized Message Passing Schedules for LDPC Decoding," Conference Record of the Thirty-Ninth Asilomar conference on Signals, Systems and Computers, Oct. 28, 2005-Nov. 1, 2005, pp. 591-595.
Zheng, H., et al., "MMSE-Based Design of Scaled and Offset BP-Based Decoding Algorithms on the Fast Rayleigh Fading Channel," IEEE International Symposium on Circuits and Systems, May 24, 2006, pp. 2061-2064.
Sakai, R., et al., "Reduced Complexity Decoding Based on Approximation of Update Function for Low-Density Parity-Check Codes," Transactions of the Institute of Electronics, Information and Communication Engineers, Feb. 1, 2007, vol. J90-A, No. 2, pp. 83-91.
Kiran Gunnam, Gwan Choi, Mark Yeary—"An LDPC decoding schedule for memory access reduction", IEEE International Conference on Acoustics, Speech, and Signal Processing (ICASSP) 2004, pp. 173-176, vol. I5.
Stefan Landner, Olgica Milenkovic—"Algorithmic and Combinatorial Analysis of Trapping Sets in Structured LDPC Codes", International Conference on Wireless Networks, Communications and Mobile Computing, 2005, pp. 630-635, vol. 1.
Hao Zhong,Tong Zhang—"Block—LDPC: A Practical LDPC Coding System Design Approach", IEEE transactions on circuits and systems—I: Regular Papers, Apr. 2005, pp. 766-775, vol. 52.
Kiran K. Gunnam, Gwan S. Choi, Weihuang Wang, Euncheol Kim, and Mark B. Yeary—"Decoding of Quasi-cyclic LDPC Codes Using an On-the-Fly Computation", Fortieth Asilomar Conference on Signals, Systems and Computers (ACSSC), 2006, pp. 1192-1199.
Thomas J. Richardson and Rudiger L. Urbanke—"Efficient Encoding of Low-Density Parity-Check Codes", IEEE Transactions on Information Theory, Feb. 2001,pp. 638-656,vol. 47, No. 2.
Tom Richardson—"Error Floors of LDPC Codes", IEEE Transactions on Information Theory, Feb. 2001, pp. 1426-1435,vol. 47, No. 2.
E. Papagiannis, C. Tjhai, M. Ahmed, M. Ambroze, M. Tomlinson—"Improved Iterative Decoding for Perpendicular Magnetic Recording", The ISCTA 2005 Conference on Feb. 4, 2005,pp. 1-4.
Kiran K. Gunnam, Gwan S. Choi, and Mark B. Yeary—"A Parallel VLSI Architecture for Layered Decoding for Array LDPC Codes", 20th International Conference on VLSI Design, 2007,6th International Conference on Embedded Systems, Jan. 2007 pp. 738-743.
David J.C. MacKay—"Information Theory, Inference, and Learning Algorithms", Cambridge University Press Sep. 2003, p. 640.
R. Michael Tanner, Deepak Sridhara, Arvind Sridharan, Thomas E. Fuja, and Daniel J. Costello, Jr—"LDPC Block and Convolutional Codes Based on Circulant Matrices", IEEE Transactions on Information Theory, Dec. 2004, pp. 2966-2984, vol. 50, No. 12.
Amin Shokrollahi—"LDPC Codes: An Introduction, In Coding, Cryptography and Combinatorics",Computer Science and Applied Logic, Birkhauser, Basel, 2004, pp. 85-110, vol. 23.
Yang Han and William E. Ryan—"LDPC Decoder Strategies for Achieving Low Error Floors", Proceedings of Information Theory and Applications Workshop, San Diego, CA, Jan. 2008, pp. 1-10.
Mohammad M. Mansour and Naresh R. Shanbhag—"Low Power VLSI decoder architectures for LDPC codes" International Symposium on Low Power Electronics and Design Proceedings of the 2002 , ICIMS Research Center, 2002, pp. 284-289.
Dale E. Hocevar—"A Reduced Complexity Decoder Architecture Via Layered Decoding of LDPC Codes", IEEE Workshop on Signal Processing Systems, 2004, pp. 107-112.
Robert G. Gallager—"Low Density Parity—Check Codes",Cambridge Mass Jul. 1963,p. 90.
T. Richardson and R. Urbanke—"Modern Coding Theory", Cambridge University Press, Preliminary version—Oct. 18, 2007, p. 590.
Kiran Gunnam, Gwan Choi, Weihuang Wang, Mark Yeary—"Multi-Rate Layered Decoder Architecture for Block LDPC Codes of the IEEE 802, 11n Wireless Standard", IEEE International Symposium on Circuits and Systems (ISCAS) 2007, pp. 1645-1648.
Kiran K. Gunnam, Gwan S. Choi, Mark B. Yeary, Shaohua Yang and Yuanxing Lee—"Next Generation Iterative LDPC Solutions for Magnetic Recording Storage", 42nd Asilomar Conference on Signals, Systems and Computers, 2008, pp. 1148-1152.
D.J.C. MacKay and R.M. Neal—"Near Shannon limit performance of low density parity check codes", Electronics Letters Mar. 13, 1997, pp. 458-459, vol. 33 No. 6.
Jinghu Chen, Ajay Dholakia, Evangelos Eleftheriou, Marc P. C. Fossorier, Xiao-Yu Hu, "Reduced-Complexity Decoding of LDPC Codes", IEEE Transactions on Communications, Aug. 2005, pp. 1288-1299,vol. 53, No. 8.
Kiran K. Gunnam, Gwan S. Choi, Mark B. Yeary and Mohammed Atiquzzaman—"VLSI Architectures for Layered Decoding for Irregular LDPC Codes of WiMax", IEEE International Conference on Communications (ICC), 2007, pp. 4542-4547.
Andrew J. Blanksby and Chris J. Howland—"A 690-mW 1-Gb/s 1024-b, Rate-1/2 Low-Density Parity-Check Code Decoder", IEEE Journal of Solid-State Circuits, Mar. 2002.pp. 404-412,vol. 37, No. 3.
Kiran Gunnam, Weihuang Wang, Gwan Choi, Mark Yeary—"VLSI Architectures for Turbo Decoding Message Passing Using Min-Sum for Rate-Compatible Array LDPC Codes", 2nd International Symposium on Wireless Pervasive Computing (ISWPC), 2007, pp. 561-566.
Kiran K. Gunnam, Gwan S. Choi, Weihuang Wang, and Mark B. Yeary—"A Parallel VLSI Architecture for Layered (56) References Cited

OTHER PUBLICATIONS

Decoding", Proceedings of the 20th International Conference on VLSI Design, 6th International Conference: Embedded Systems, 2007, pp. 738-743.

R.Michael Tanner—"A Recursive Approach to Low Complexity Codes", IEEE transaction on Information Theory, Sep. 1981, pp. 533-547, vol. IT-27, No. 5.

Mohammad M. Mansour, and Naresh R. Shanbhag—"A 640-Mb/s 2048-Bit Programmable LDPC Decoder Chip", IEEE Journal of Solid-State Circuits, Mar. 2006, pp. 684-698, vol. 41, No. 3.

Badri N. Vellambi R, and Faramarz Fekri, "An Improved Decoding Algorithm for Low-Density Parity-Check Codes over the Binary Erasure Channel", IEEE GLOBECOM 2005 proceedings, pp. 1182-1186.

Yang Han, William E. Ryan—"Low-Floor Decoders for LDPC Codes", IEEE Transactions on Communications, vol. 57, No. 6, Jun. 2009, pp. 1663-1673.

PCT International Search Report dated Feb. 9, 2009 from International Application No. PCT/US 08/86537.

PCT International Search Report dated May 15, 2009 from International Application No. PCT/US 09/39279.

PCT International Search Report dated Feb. 12, 2009 from International Application No. PCT/US 08/86523.

PCT International Search Report dated May 28, 2009 from International Application No. PCT/US 09/41215.

PCT International Search Report dated May 15, 2009 from International Application No. PCT/US 09/39918.

Vila Casado, Andres I., Weng, Wen-Yen and Wesel, Richard D. "Multiple Rate Low-Density Parity-Check Codes with Constant Blocklength," IEEE 2004, pp. 2010-2014.

Vila Casado, Andres I. "Variable-rate Low-denisty Parity-check Codes with Constant Blocklength," UCLA Technologies Available for Licensing Copyright © 2009 The Regents of the University of California. http://www.research.ucla.edu/tech/ucla05-074.htm (2 pages).

Vila Casado, Andres I., Weng, Wen-Yen, Valle, Stefano and Wesel, Richard D. "Multiple-Rate Low-Density Parity-Check Codes with Constant Blocklength," IEEE Transactions on Communications, vol. 57, No. 1, Jan. 2009; pp. 75-83.

Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Jul. 2006 (available online at http://dropzone.tamu.edu), pp. 1-5.

Richardson, Tom, "Error Floors of LDPC Codes," Allerton Conf. on Communication, Control and Computing, (Monticello, Illinois), Oct. 2003, pp. 1426-1435.

Cole, Chad A. and Hall, Eric K., "Analysis and Design of Moderate Length Regular LDPC Codes with Low Error Floors," Proc, 40th Conf. Information Sciences and Systems, Princeton, NJ, 2006, 6 pgs.

Cavus et al., "A Performance Improvement and Error Floor Avoidance Technique for Belief Propagation Decoding of LDPC Codes," IEEE 16th International Symposium, Personal, Indoor & Mobile Radio Communications (PIMRC), Berlin, Germany Sep. 11-14, 2005, pp. 2386-2390.

Cavus, Enver et al., "An IS Simulation Technique for Very Low BER Performance Evaluation of LDPC Codes," IEEE International Conference on Communications, Jun. 1, 2006, pp. 1095-1100.

Sripimanwat, K., "Turbo Code Applications: A Journey From a Paper to Realization", Oct. 26, 2005, Springer, p. 27.

Tuchler, M., et al., "Improved Receivers for Digital High Frequency Waveforms Using Turbo Equalization," Military Communications Conference; Milcom 2002 Proceedings; Anaheim, CA, Oct. 7-10, 2002; IEEE Military Communications Conference, New York, NY; IEEE; US, vol. 1, Oct. 7, 2002; pp. 99-104; XP002966498.

Alghonaim, E., et al., "Improving BER Performance of LDPC codes Based on Intermediate Decoding Results," Signal Processing and Communications; 2007; ICSPC, 2007; IEEE International Conference; IEEE, Piscataway, NJ; USA; Nov. 24, 2007; pp. 1547-1550; XP031380831.

K. Gunnam et al., "Value-Reuse Properties of Min-Sum for GF(q)" (dated Oct. 2006) Dept. of ECE, Texas A&M University Technical Note, published about Aug. 2010.

K. Gunnam et al., "Value-Reuse Properties of Min-Sum for GF (q)" (dated Jul. 2008) Dept. of ECE, Texas A&M University Technical Note, published about Aug. 2010.

\* cited by examiner

TRAPPING-SET DATABASE FOR A LOW-DENSITY PARITY-CHECK DECODER

While processing the output of a channel detector, a low-density parity-check (LDPC) decoder may encounter one or more trapping sets, which prevents the decoder from converging on the correct codeword. A trapping set is a binary vector x of length n ($\ll$N) that represents a sub-graph in a Tanner graph of the corresponding LDPC code, where N is the length of the codewords used in the LDPC code. A trapping set is usually denoted by a pair (a, b) of positive integers, where a is the Hamming weight of binary vector x, and b is the number of unsatisfied checks (USCs), i.e., the Hamming weight of the syndrome $xH^T$, where H is the parity-check matrix, and T denotes transposition. It is known that certain trapping sets (often referred to as dominant trapping sets) have a particularly strong influence on the bit-error rate (BER) and error-floor characteristics of an LDPC decoder.

If the output of an LDPC decoder contains a known trapping set, then certain measures can be taken to steer the LDPC decoder away from the trapping set and have it converge on a valid codeword. However, collection, ranking, and evaluation of trapping sets for use in an LDPC decoder are non-trivial and time-consuming tasks. More specifically, for a given LDPC implementation, all possible trapping sets might number in the millions. In addition, the pluralities of dominant trapping sets corresponding to different implementations of the same LDPC code may differ from one another. For example, research on LDPC-enabled hard drives has shown that trapping sets are influenced by the hard-drive's jitter profile, inter-symbol interference characteristics, and pulse-shaping scheme. Since these attributes can vary not only between hard drives of different manufacturers, but also between different hard drive models from the same manufacturer or even between different production runs of the same model, each hard drive tends to have a unique plurality of dominant trapping sets.

Disclosed herein are various embodiments of a machine-implemented method of generating trapping-set information for use in LDPC-decoding processing of read signals, e.g., generated by sensing a storage medium, such as a magnetic platter. In one embodiment, the method can be implemented as an add-on to any other trapping-set search method in which the discovered trapping sets are evaluated to determine their influence on the overall bit-error rate and/or error-floor characteristics of the LDPC decoder. The method can advantageously reuse at least some of the computational results obtained during this evaluation, thereby requiring a relatively small amount of additional computations, while providing a significant benefit of discovering many more trapping sets in addition to the ones that are being evaluated. At least some of the new trapping sets discovered in this manner tend to be dominant trapping sets.

Some of the disclosed embodiments include (i) a trapping-set database generated using the above-mentioned machine-implemented method and/or (ii) an integrated circuit that implements a read channel and is configured to use the trapping-set database for decoding processing of read signals.

Other embodiments of the invention will become more fully apparent from the following detailed description and the accompanying drawings, in which.

Figure 1:
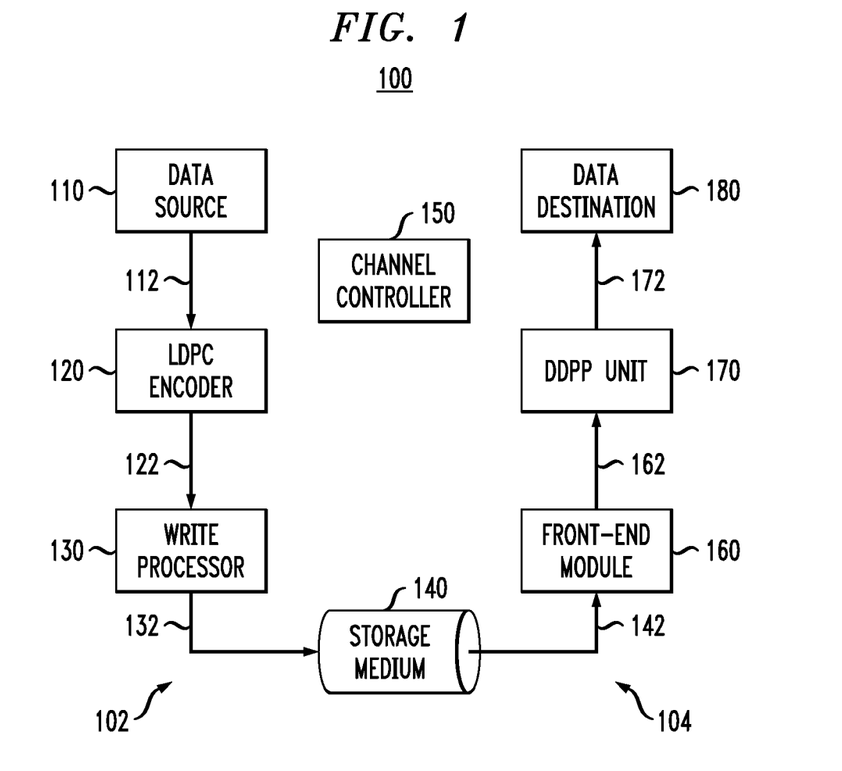
FIG. 1 shows a block diagram of a communication system according to an embodiment of the disclosure.

The following acronyms/abbreviations are used in the description of embodiments and in the drawings:
ARM Advanced RISC (reduced instruction set computing) Machine;
BER Bit-Error Rate;
DDPP Detecting, Decoding, and Post-Processing;
EBN Erroneous Bit Node;
ISI Inter-Symbol Interference;
LDPC Low-Density Parity Check;
LLR Log-Likelihood Ratio;
MSC Mis-Satisfied Check;
OLTSG On-Line Trapping-Set Generation;
PP Post-Processing;
RAM Random Access Memory;
ROM Read-Only Memory;
SNR Signal-to-Noise Ratio;
TS Trapping Set;
USC Un-Satisfied Check;

FIG. 1 shows a block diagram of a communication system 100 according to an embodiment of the disclosure. System 100 has a storage medium 140 (e.g., a flash drive, magnetic platter, etc). Storage medium 140 receives data for storage through a write channel 102 comprising a data source (e.g., input port) 110, a low-density parity-check (LDPC) encoder 120, and a write processor 130. The stored data can be retrieved from storage medium 140 through a read channel 104 comprising a front-end module 160, a detecting, decoding, and post-processing (DDPP) unit 170, and a data destination (e.g., output port) 180. The operations of write channel 102 and read channel 104 are controlled by a channel controller 150. In one embodiment, channel controller 150 is an ARM (Advanced RISC Machine) processor.

In operation, data source 110 provides a set of bits 112, often referred to as an original information word, to LDPC encoder 120. LDPC encoder 120 encodes original information word 112 using an LDPC code to generate a corresponding codeword 122, often referred to as the channel-input codeword. LDPC encoding is known in the art and is described in more detail, e.g., in International Patent Application Publication No. WO 2010/019168, which is incorporated herein by reference in its entirety. Original codeword 122 is supplied to write processor 130, which converts codeword 122 into an appropriate write signal 132 and applies the write signal to storage medium 140. Write signal 132 controllably alters the state of storage medium 140, thereby causing codeword 122 to be stored in the storage medium.

To retrieve codeword 122 from storage medium 140, a sensor senses the corresponding location(s) in the storage medium to obtain a read signal 142, which is supplied to front-end module 160. Front-end module 160 filters read signal 142 to convert it into a filtered signal 162.

A channel detector located in DDPP unit 170 converts filtered signal 162 into a corresponding set of log-likelihood ratio (LLR) values and supplies said LLR values to DDPP unit 170.

For example, an LLR value may comprise (i) a sign bit that represents the detector's best guess (hard decision) regarding the bit value stored at the corresponding sensed location in storage medium 140 and (ii) one or more magnitude bits that represent the detector's confidence in the hard decision. In one embodiment, the channel detector may output each LLR value as a five-bit value, where the most-significant bit is the sign bit and the four least-significant bits are the confidence bits. For example, a five-bit LLR value of 00000 indicates a hard decision of 0 with minimum confidence, while a five-bit LLR value of 01111 indicates a hard decision of 0 with maximum confidence. Intermediate values (e.g., between 0000 and 1111) represented by confidence bits correspond to respective intermediate confidence levels. Similarly, a five-bit LLR value of 10001 indicates a hard decision of 1 with minimum confidence, while a five-bit LLR value of 11111 indicates a hard decision of 1 with maximum confidence, wherein the binary value of 10000 is unused. Other numbers of bits and other representations of confidence levels may alternatively be used as well.

An LDPC decoder located in DDPP unit 170 performs LDPC decoding on the LLR values generated by the channel detector, which, if necessary, is followed by the application of one or more post-processing (PP) methods. More specifically, DDPP unit 170 is configured to apply PP methods when the LDPC-decoding process fails, meaning, e.g., that, after a maximum allotted number of decoding iterations, the output word of the LDPC decoder (not explicitly shown in FIG. 1) still has one or more unsatisfied checks (USCs). Depending on the actual number of USCs, DDPP unit 170 might (1) send a request to channel controller 150 to have the sensor reread the corresponding location(s) in storage medium 140 and then repeat the decoding process for the corresponding newly generated LLR values or (2) alter the input of the LDPC decoder and restart the LDPC iterations with the altered input, but without a reread. DDPP unit 170 typically uses the first option when the output word of the failed LDPC decoder has a relatively large number (e.g., more than about sixteen) of USCs. DDPP unit 170 typically uses the second option when the output word of the failed LDPC decoder has a relatively small number of USCs. After the LDPC decoder converges on a valid codeword, DDPP unit 170 converts that codeword into the corresponding original information word and directs said information word, via an output signal 172, to data destination 180.

One of the PP methods that DDPP unit 170 may employ under the second option is a so-called list-decoding method, which is described in more detail in the above-cited International Patent Application Publication No. WO 2010/019168. Briefly, the list-decoding method is used for detecting and escaping from trapping sets. More specifically, an observed pattern of errors in the output word of the failed LDPC decoder is matched against a database of trapping sets that is maintained in a dedicated memory (not shown in FIG. 1) of DDPP unit 170. The database of trapping sets may contain the indices of the USCs in each trapping set and the indices of the erroneous bit nodes (EBNs) associated with those USCs. If a match is found in the memory, then the bit-node indices of the trapping set are retrieved from the database. One or more hard-decision values corresponding to the EBNs are flipped or erased, and the corresponding confidence bits are appropriately changed to modify the initial LLR values. Then, DDPP unit 170 restarts the LDPC decoding process using the modified LLR values in a new input applied to the LDPC decoder. Often, this modification of the LLR values will "break" the trapping set(s) and cause the restarted LDPC decoder to converge on a valid codeword.

In one embodiment, the database of trapping sets employed by DDPP unit 170 is stored in a trapping-set read-only memory (TS-ROM, not explicitly shown in FIG. 1) and contains trapping-set (TS) information on the trapping sets that have been discovered off-line using software and/or hardware simulation tools and then loaded into the TS-ROM of DDPP unit 170 at the production facility. Representative methods of identifying and recording trapping sets using off-line simulation tools are disclosed, e.g., in the above-cited International Patent Application Publication No. WO 2010/019168. For at least some of the reasons alluded to in the background section, the list of trapping set discovered off-line using the above-indicated methods is usually incomplete.

In an alternative embodiment, the database of trapping sets employed in DDPP unit 170 comprises two TS sub-lists. The first TS sub-list is similar to the just-mentioned TS database generated offline and loaded into the TS-ROM of DDPP unit 170 at the production facility. The second TS sub-list is stored in a nonvolatile TS memory (e.g., TS-RAM, not explicitly shown in FIG. 1) of DDPP unit 170 and contains TS information on the trapping sets that have been discovered on-line by communication system 100 itself, e.g., using an appropriate embodiment of method 200 described below in reference to FIG. 2.

In one configuration, communication system 100 can generate TS information for storage in the TS-RAM of DDPP unit 170 while operating in a special on-line TS-generating (OLTSG) operating mode. Communication system 100 enters the OLTSG operating mode when write channel 102 and read channel 104 are idle, e.g., not receiving external write and read requests from data source 110 and data destination 180. In effect, the OLTSG operating mode exploits intermittent availability of the data-processing resources of read channel 104 to discover and store in the TS-RAM of DDPP unit 170 new TS information, e.g., information on the trapping sets that are important to the performance characteristics of this particular specimen of communication system 100 but which information is not stored in the TS-ROM of the DDPP unit. When communication system 100 enters the normal operating mode and the list-decoding method is invoked, DDPP unit 170 searches both TS-ROM and TS-RAM memories while attempting to escape from any currently occurring trapping set(s). Since the TS-RAM of DDPP unit 170 can be used to expand the accessible database of important (e.g., dominant) trapping sets, the BER and error-floor characteristics of communication system 100 are likely to be improved compared to the corresponding characteristics of an embodiment without a TS-RAM memory.

Figure 2:
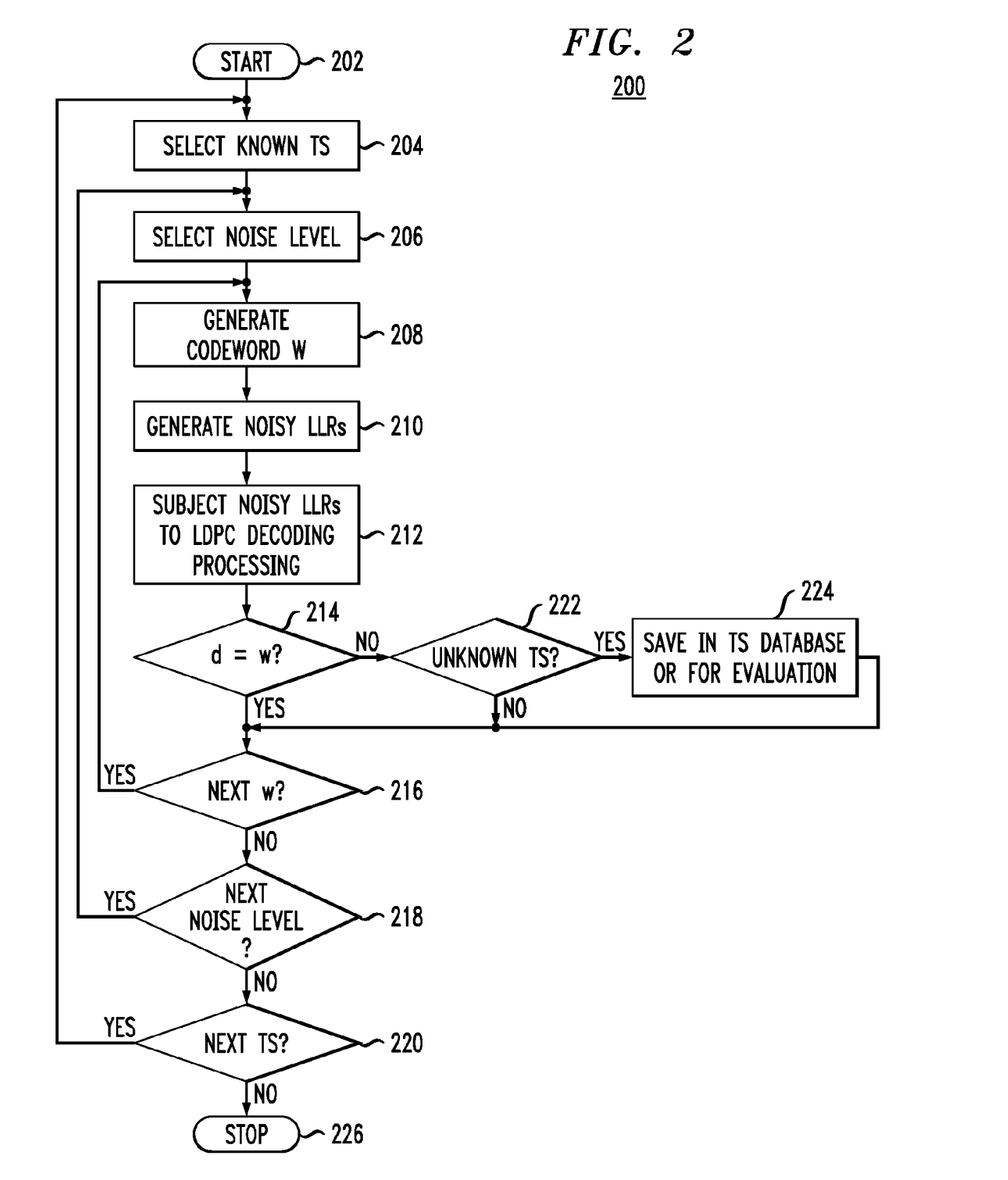
FIG. 2 shows a flowchart of a method of searching for new trapping sets according to an embodiment of the disclosure.
Figure 4:
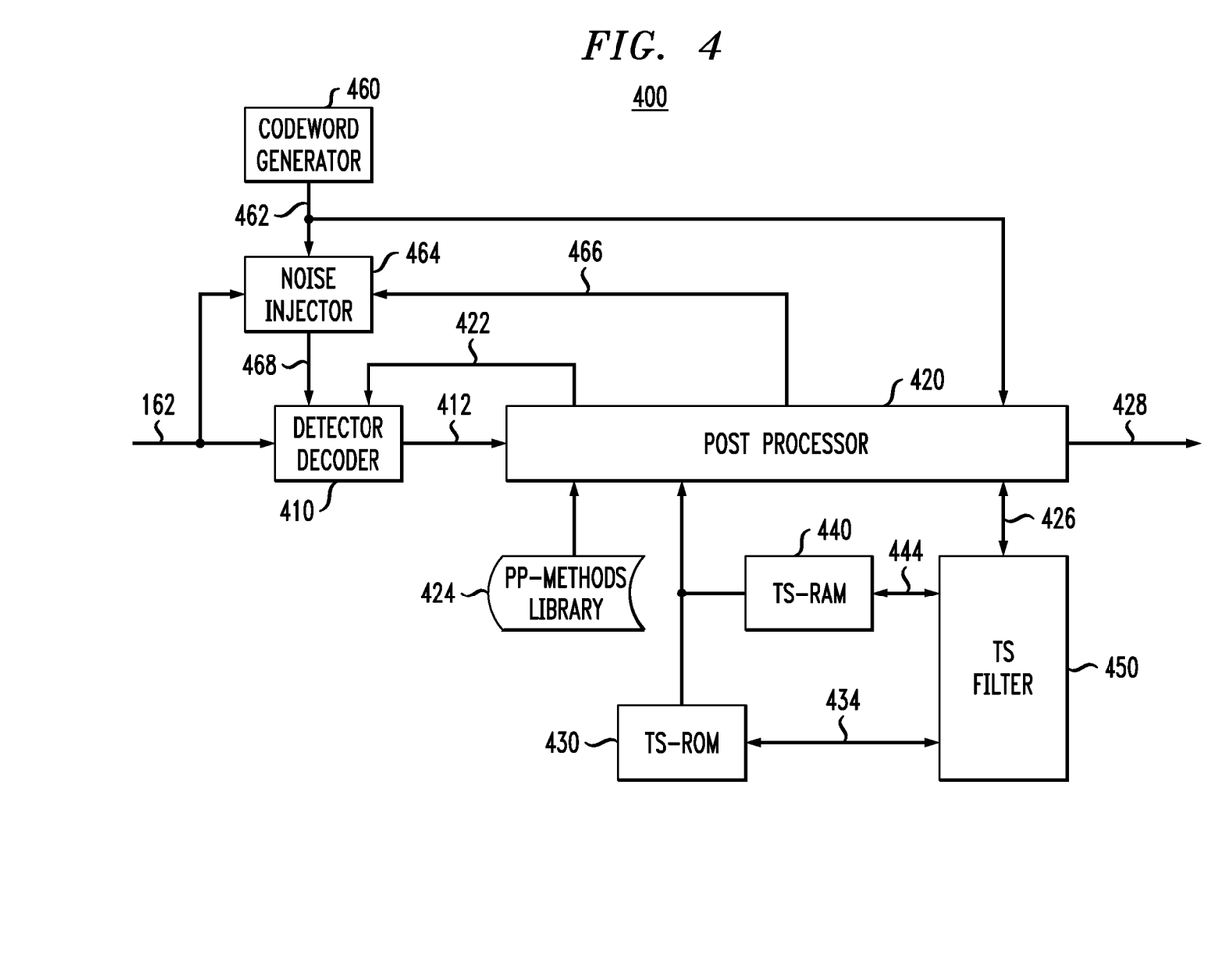
FIG. 4 shows a block diagram of a detecting, decoding, and post-processing (DDPP) unit that can be used in the communication system of FIG. 1 according to an embodiment of the disclosure.

FIG. 2 shows a flowchart of a method 200 of searching for unknown trapping sets according to an embodiment of the disclosure. In one embodiment, method 200 can be used to implement an OLTSG (On-Line Trapping-Set Generation) operating mode in DDPP unit 400 (FIG. 4). In an alternative embodiment, method 200 can be implemented in a read-channel simulator, e.g., for offline generation of a TS database. Some or all entries of this database can be loaded into TS-ROM 430 of DDPP unit 400 (see FIG. 4) at the production facility prior to shipping the corresponding communication system (e.g., system 100, FIG. 1) to a customer. Some examples of read-channel simulators in which the latter embodiment of method 200 can be implemented are disclosed, e.g., in Russian Patent Application Serial Nos. 2012135285 (filed on Aug. 16, 2012) and 2012139074 (filed on Sep. 12, 2012), both of which are incorporated herein by reference in their entirety.

Method 200 begins at step 202 when DDPP unit 400 enters an OLTSG operating mode or the corresponding software is loaded into a read-channel simulator.

At step 204, a trapping set is selected from a database of known trapping sets. Any suitable criteria can be used for selecting a trapping set from the TS database. For example, the known trapping sets can first be sorted based on a selected characteristic or criterion to form an ordered list and then selected, one by one, based on the order in which they appear in the ordered list.

At step 206, a noise level is selected. In a representative embodiment, the noise level has two contributing components. The first contributing component is a localized noise component that represents the level ($\epsilon$) of noise that is to be injected only into the TS positions of a codeword. Different occurrences of step 206 may use different respective values of $\epsilon$. The second contributing component is a distributed noise component that represents the overall signal-to-noise ratio (SNR) in the read channel. This component may include contributions from the write noise, ISI noise, read noise, etc. A range of SNR values of interest can be identified based on the expected or actual performance characteristics of the read channel in question. Then, at different occurrences of step 206, different SNR values from the identified range can be selected to appropriately sample this range of interest.

At step 208, a codeword (w) is generated. For example, an ordered list of original information words can be used to generate different respective codewords for different respective occurrences of step 208. In this case, step 208 can be implemented using the sub-steps of: (i) selecting an original information word from the ordered list of original information words, e.g., based on the order of appearance in the ordered list, and (ii) applying an LDPC generator matrix to the selected original information word to generate the corresponding codeword.

In some embodiments, step 208 (and also step 216) may be optional, e.g., as explained below in the description of DDPP 400 (FIG. 4).

At step 210, a set of noisy LLR values is generated based on (i) codeword w generated at step 208, (ii) the noise-level components selected at step 206, and (iii) the trapping set selected at step 204. In one embodiment of step 210, the confidence bits of each LLR value are calculated using Eq. (1):

$$\alpha_k = 1 - I_k \epsilon - F_k \quad (1)$$

where k is a bit index whose value designates a bit position in the codeword; $\alpha_k$ is a scaling factor to be applied to the binary value expressed by the magnitude bits of the k-th LLR value; $I_k$ is the indicator function indicating whether (in which case, $I_k=1$) or not (in which case, $I_k=0$) the k-th bit belongs to the trapping set selected at step 204; $\epsilon$ represents the localized noise component that is being injected into the TS positions of codeword w; and $F_k$ represents the distributed noise component. For a read channel characterized by significant ISI and/or jitter, $F_k$ is codeword-dependent, i.e., $F_k=F_k(W)$. $F_k$ can be generated based on the actual or expected performance characteristics of the read channel in question. Indicator function $I_k$ has a value of one for the bit positions corresponding to the trapping set selected at step 204, and a value of zero for all other bit positions. In one embodiment, $F_k=0$.

At step 212, the set of noisy LLR values generated at step 210 is subjected to LDPC decoding processing. The LDPC decoding processing is carried out in a conventional manner and is terminated when the decoder converges on a valid codeword or the maximum allowed number of decoding iterations is reached. The hard decision generated by the decoder when the processing is terminated is output word d.

At step 214, output word d generated at step 212 is compared with codeword w generated at step 208. If d=w, then the processing of method 200 is directed to step 216. If d≠w, then the processing is directed to step 222.

Step 216 serves to cycle method 200 through different codewords. If it is desirable to search for new trapping sets corresponding to another codeword, then the processing is directed back to step 208 to generate another codeword using the same known trapping set and noise level. Otherwise, the processing is directed to step 218.

Step 218 serves to cycle method 200 through different noise levels. If it is desirable to search for new trapping sets using a different noise level, then the processing is directed back to step 206 to generate another codeword for the same known trapping set, but using a different noise level. Otherwise, the processing is directed to step 220.

Step 220 serves to cycle method 200 through different known trapping sets. If it is desirable to search for new trapping sets corresponding to a different known trapping set, then the processing is directed back to step 204. Otherwise, the processing is directed to step 226, where the processing is terminated.

At step 222, differences between output word d generated at step 212 and codeword w generated at step 208 are evaluated to determine whether or not output word d contains an unknown trapping set. This evaluation can be carried out, e.g., by checking a trapping set detected in output word d against the current TS database. If no match is found in the TS database, then it is concluded that output word d contains an unknown trapping set, and the processing of method 200 is directed to step 224. If a match is found in the TS database, then step 224 is bypassed, and the processing is directed to step 216.

At step 224, the unknown trapping set detected at step 222 in output word d is either saved in the TS database or temporarily saved in the memory for further evaluation. In one embodiment, this further evaluation can be carried out, e.g., using method 500, which is described below in reference to FIG. 5.

Figure 3:
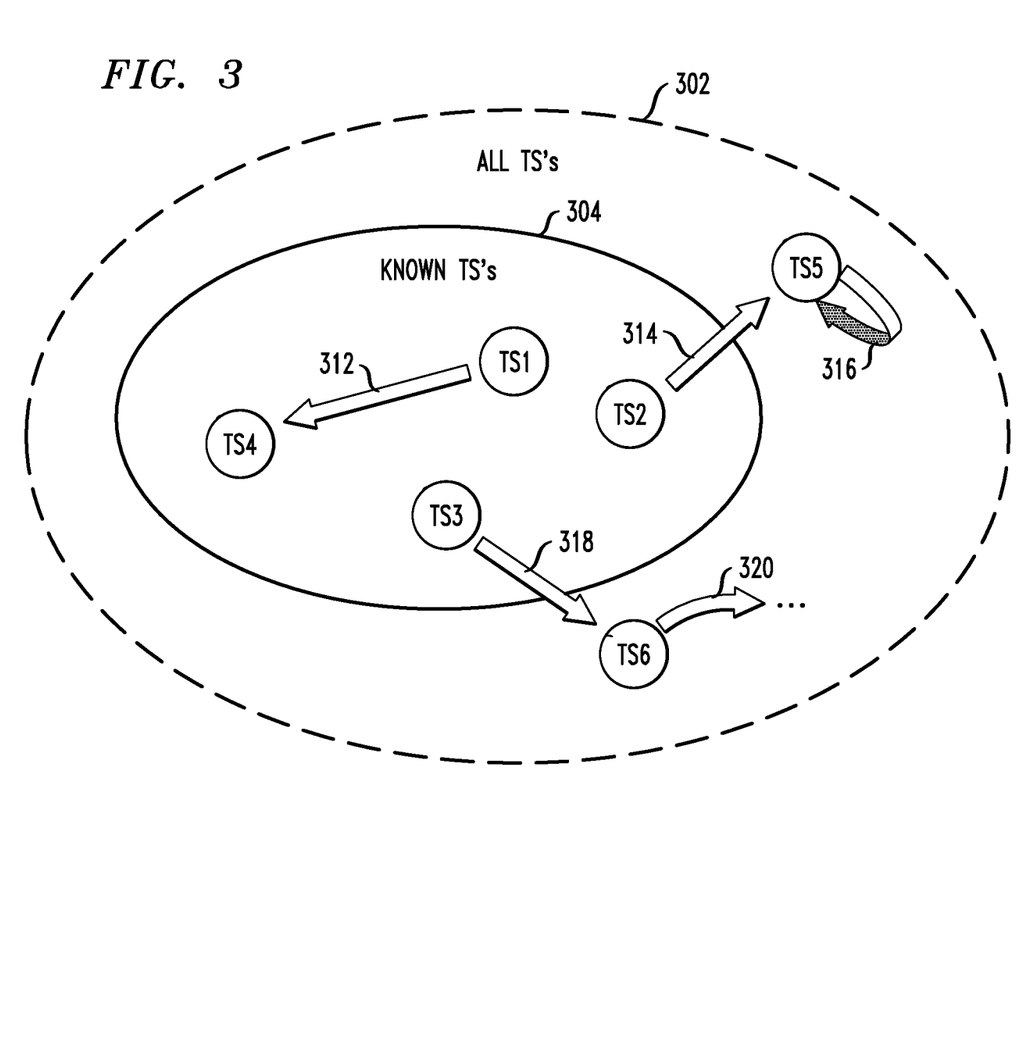
FIG. 3 graphically illustrates several possible routes/outcomes of a trapping-set search implemented using the method of FIG. 2 according to an embodiment of the disclosure.

FIG. 3 graphically illustrates several possible routes/outcomes of the above-outlined search process implemented using method 200 (FIG. 2) according to an embodiment of the disclosure. More specifically, the larger oval, whose boundary is indicated in FIG. 3 by a dashed line 302, graphically shows the TS space representing all trapping sets of a particular LDPC code. The smaller oval, whose boundary is indicated in FIG. 3 by a solid line 304, graphically shows the TS space representing the known trapping sets, e.g., the trapping sets enumerated in the TS database stored in TS-ROM 430 and TS-RAM 440 (see FIG. 4). The various circles labeled TSi (where i=1, ..., 6) represent respective trapping sets, with the location of each circle with respect to ovals 302 and 304 indicating whether the trapping set is known or not. The various block arrows in FIG. 3 graphically illustrate representative routes that a TS-search process of method 200 (FIG. 2) might take in the TS space.

For example, block arrow 312 indicates a TS-search route, in which: (A) trapping set TS1 is initially selected at step 204 from the TS database at step 204; (B) decoding of the corresponding noisy LLR values at step 212 produces a decoding error in the LDPC decoder; and (C) a TS filter (e.g., implemented by steps 214 and 222, FIG. 2) determines that the decoding error is due to the presence, in the output word generated by the LDPC decoder, of one of the known trapping sets, e.g., TS4. This TS-search route does not result in the discovery of a new trapping set to be stored in the TS database.

As another example, block arrows 314 and 316 indicate a TS-search route that leads to the discovery of an unknown stable trapping set, labeled TS5. More specifically, block arrow 314 indicates a first part of this TS-search route, in which: (A) trapping set TS2 is initially selected at step 204 from the TS database; (B) decoding of the corresponding noisy LLR values at step 212 produces a decoding error in the LDPC decoder; and (C) the TS filter (e.g., implemented by steps 214 and 222, FIG. 2) determines that the decoding error is due to the presence, in the output word generated by the LDPC decoder, of an unknown trapping set, TS5. Block arrow 316 indicates a second part of this TS-search route, e.g., corresponding to step 224, in which: (D) decoding of noisy LLR values corresponding to TS5 produces a decoding error in the LDPC decoder and (E) it is determined that the decoding error is again due to the presence in the output word of TS5. This TS-search route results in the discovery of a new trapping set to be stored in the TS database.

As yet another example, block arrows 318 and 320 indicate a TS-search route that leads to the discovery of an unknown unstable trapping set, labeled TS6. More specifically, block arrow 318 indicates a first part of this TS-search route, in which: (A) trapping set TS3 is initially selected from the TS database at step 204; (B) decoding of the corresponding noisy LLR values at step 212 produces a decoding error in the LDPC decoder; and (C) the TS filter (e.g., implemented by steps 214 and 222, FIG. 2) determines that the decoding error is due to the presence, in the output word generated by the LDPC decoder, of an unknown trapping set, TS6. Block arrow 320 indicates a second part of this TS-search route, e.g., corresponding to step 224, in which: (D) decoding of the noisy LLR values corresponding to TS6 produces a decoding error in the LDPC decoder and (E) it is determined that the decoding error is due to the presence in the output word generated by the LDPC decoder of a trapping set that is different from TS6. Depending on the particular embodiment of method 200, this TS-search route may result in the new trapping set being added to the TS database. For example, the newly found, non-dominant trapping set might be stored only if there is more than a specified amount of unused capacity in the TS memory.

FIG. 4 shows a block diagram of a DDPP unit 400 that can be used as DDPP unit 170 according to one embodiment of the disclosure. DDPP unit 400 can be configured to operate in a normal operating mode or in an OLTSG operating mode. Each of these operating modes is described in more detail below.

In a normal operating mode, an LDPC decoder in detector/decoder unit 410 of DDPP unit 400 receives LLR values from the channel detector, which has generated said LLR values based on filtered signal 162 (see FIG. 1). Detector/decoder 410 applies LDPC decoding processing to the LLR values and outputs the decoding results, via a decoder-output signal 412, to a post-processor 420. If decoder-output signal 412 represents a valid codeword, i.e., a codeword that has passed the LDPC parity checks, then post-processor 420 outputs the unaltered decoder-output signal 412 as a post-processor output signal 428. The valid codeword is then used, as known in the art, to compute the corresponding original information word 172 for data destination 180 (FIG. 1). If decoder-output signal 412 does not represent a valid codeword, then post-processor 420 invokes one or more PP methods from a PP-methods library 424.

In one embodiment, PP-methods library 424 is a memory that contains one or more executable programs representing the corresponding post-processing methods, such as the above-mentioned list-decoding method. If post-processor 420 needs to perform a particular PP method, then the post-processor retrieves the corresponding executable program from PP-methods library 424 and runs that program. If post-processor 420 executes the list-decoding method, then, during the execution, the post-processor may access a TS-ROM 430 and a TS-RAM 440 to find matches to the errors observed in the output word of signal 412. If a match is found, then DDPP unit 400 can help the decoding process to escape from (i.e., break) the trapping set(s), e.g., by (i) using the TS information stored in TS-ROM 430 and/or TS-RAM 440 to identify the EBNs of the trapping set(s); (ii) flipping one or more EBNs; (iii) communicating to detector/decoder 410, via a feedback signal 422, the corresponding changes made to the LLR values; and (iv) configuring detector/decoder 410 to restart the decoding process with the changed LLR values.

As indicated above, TS-ROM 430 may come from the production facility preloaded with TS information that had been generated off-line. In contrast, TS-RAM 440 may come from the production facility without any TS information stored therein, and the TS information to be stored in the TS-RAM can be generated by the corresponding communication system (e.g., communication system 100, FIG. 1) on-line, while operating in the above-mentioned OLTSG operating mode.

In the OLTSG operating mode, DDPP unit 400 can discover new trapping sets, e.g., using an embodiment of method 200 (FIG. 2). To illustrate how method 200 can be implemented in DDPP unit 400, the following description refers to specific processing steps of method 200 while pointing out individual components of the DDPP unit that can carry out the execution of those processing steps.

In an attempt to find a new trapping set for storage in TS-RAM 440, post-processor 420 first executes step 204 to select a known trapping set from (i) the TS sub-list stored in TS-ROM 430 or (ii) the TS sub-list stored in TS-RAM 440, and retrieves the corresponding TS information therefrom. Post-processor 420 then provides the retrieved TS information, via a control signal 466, to a noise injector 464.

Since trapping sets can be influenced by the read-channel's jitter profile and inter-symbol interference (ISI) characteristics, the subsequent processing steps are codeword-dependent and may need to be cyclically repeated, with each cycle invoking a different codeword, but using the same trapping set. The corresponding cycle includes the processing steps located in the processing flow between steps 208 and 216. As indicated above, in some embodiments, steps 208 and 216 are optional and can be excluded from the processing flow.

A codeword generator 460 is configured to implement step 208 by generating a valid codeword 462 and providing respective copies of it to a noise injector 464 and post-processor 420. Any suitable algorithm can be used in codeword generator 460 to provide different valid codewords for different cycles of the cyclical process. In one embodiment, codeword generator 460 can be a part of the corresponding write channel, e.g., a part of LDPC encoder 120 in write channel 102 (FIG. 1).

In an alternative embodiment, DDPP unit does not have codeword generator 460 and instead uses signal 162, e.g., as described below.

In one embodiment, noise injector 464 implements step 210 based on signals 462 and 466. In an alternative embodiment (in which codeword generator 460 is absent), noise injector 464 implements step 210 based on signals 162 and 466. More specifically, noise injector 464 injects a selected amount of noise into the bit positions identified in control signal 466, e.g., by altering the confidence bits of the corresponding LLR values of the codewords represented by signal 462 or 162. Noise injector 464 then provides the resulting "noisy" set of LLR values, via a signal path 468, to the LDPC decoder in unit 410. The decoder then tries to decode the received LLRs in a conventional manner. This decoding attempt implements step 212.

Note that a trapping set is often composed of multiple inter-linked cycles on the corresponding sub-graph of the Tanner graph. For certain read-channel configurations with relatively low noise levels, the message-passing algorithm typically used in an LDPC decoder (e.g., the LDPC decoder in unit 410) can get trapped in these cycles because messages from the USC nodes of the sub-graph are not able to overcome the relatively strong bias of the mis-satisfied check (MSC) nodes of the sub-graph, such that the bit nodes corresponding to the trapping set become "trapped" in a wrong state. The LDPC decoder, lacking enough influence from the portions of the Tanner graph external to the TS sub-graph, cannot escape from this state by itself, thereby causing a TS-error event. The noise injected, by noise injector 464, into the TS positions of the set of LLR values representing the selected codeword can (i) help the message-passing algorithm to escape the inter-linked cycles of the TS sub-graph and (ii) be used to quantify the stability of the trapping set.

One possible outcome of the decoder in unit 410 trying to decode the noisy LLRs is that the decoding process converges on the correct codeword (e.g., that initially generated by codeword generator 460). This outcome does not lead to a discovery of a new trapping set. Another possible outcome of the decoding process is that it fails to converge on the correct codeword. In this case, the output word represented by signal 412 generated by the decoder in unit 410 at the end of the failed decoding process is directed to post-processor 420 for evaluation. For example, post-processor 420 can evaluate the received output word by comparing it with the correct codeword, e.g., received from codeword generator 460 via signal 462.

In one embodiment, post-processor 420 can perform this comparison operation by applying an XOR (exclusive OR) function to the two binary words that are being compared. If two corresponding bits of the two words match, then the output of the XOR function for that particular bit position is zero. If the two corresponding bits do not match, then the output of the XOR function for that particular bit position is one, which indicates the presence of an EBN in the output word received via signal 412. Based on the identified EBNs, post-processor 420 can identify a candidate trapping set, e.g., by (i) tracing the edges of the corresponding sub-graph around the EBNs and (ii) identifying the corresponding USC and MSC nodes. Post-processor 420 then directs all or part of this TS information, via a communication path 426, to a TS filter 450.

TS filter 450 is configured to determine whether or not the candidate trapping set identified by post-processor 420 is already present in TS-ROM 430 or TS-RAM 440. This determination corresponds to step 222. If TS filter 450 finds a copy of the candidate trapping set in TS-ROM 430 or TS-RAM 440, then this outcome does not lead to a discovery of a new trapping set. However, if TS filter 450 does not find a copy of the candidate trapping set in TS-ROM 430 or TS-RAM 440, then the TS filter can do one of the following:

(i) save the candidate trapping set in TS-RAM 440, thereby expanding the TS sub-list stored therein; or (ii) instruct post-processor 420, via communication path 426, to initiate further evaluation of the candidate trapping set.

Option (ii) can be used, e.g., when either the available memory volume or the memory-access speed is limited, or both, so that it is practical to store only some (e.g., only dominant) trapping sets in TS-RAM 440. This part of the processing corresponds to step 224.

In one embodiment, said further evaluation of the candidate trapping set can be performed, e.g., by testing its stability. In one embodiment, the stability testing includes (i) generating a codeword, (ii) injecting noise into one or more of the bit positions of the codeword corresponding to the candidate trapping set, and (iii) attempting to decode the resulting noisy set of LLR values. The candidate trapping set is deemed to be stable if the decoding process fails and the corresponding output word represented by signal 412 generated by the LDPC decoder in unit 410 at the end of the failed decoding process again contains the candidate trapping set. Otherwise, the candidate trapping set is deemed unstable.

If it is found that the candidate trapping set is stable in the above-explained sense of the term, then post-processor 420 instructs TS filter 450, via communication path 426, to add this candidate trapping set to the TS sub-list saved in TS-RAM 440, thereby expanding the TS database. One of ordinary skill in the art will appreciate that a stable trapping set found in this manner is also likely to be a dominant trapping set.

If it is found that the candidate trapping set is unstable, then post-processor 420 can instruct TS filter 450 to discard it and not save it in TS-RAM 440. The search for new trapping sets then resumes, e.g., with codeword generator 460 generating a new codeword for the noise injection using the same trapping set or with post-processor 420 selecting and retrieving a next (different) trapping set from the TS sub-lists stored in TS-ROM 430 and TS-RAM 440.

Figure 5:
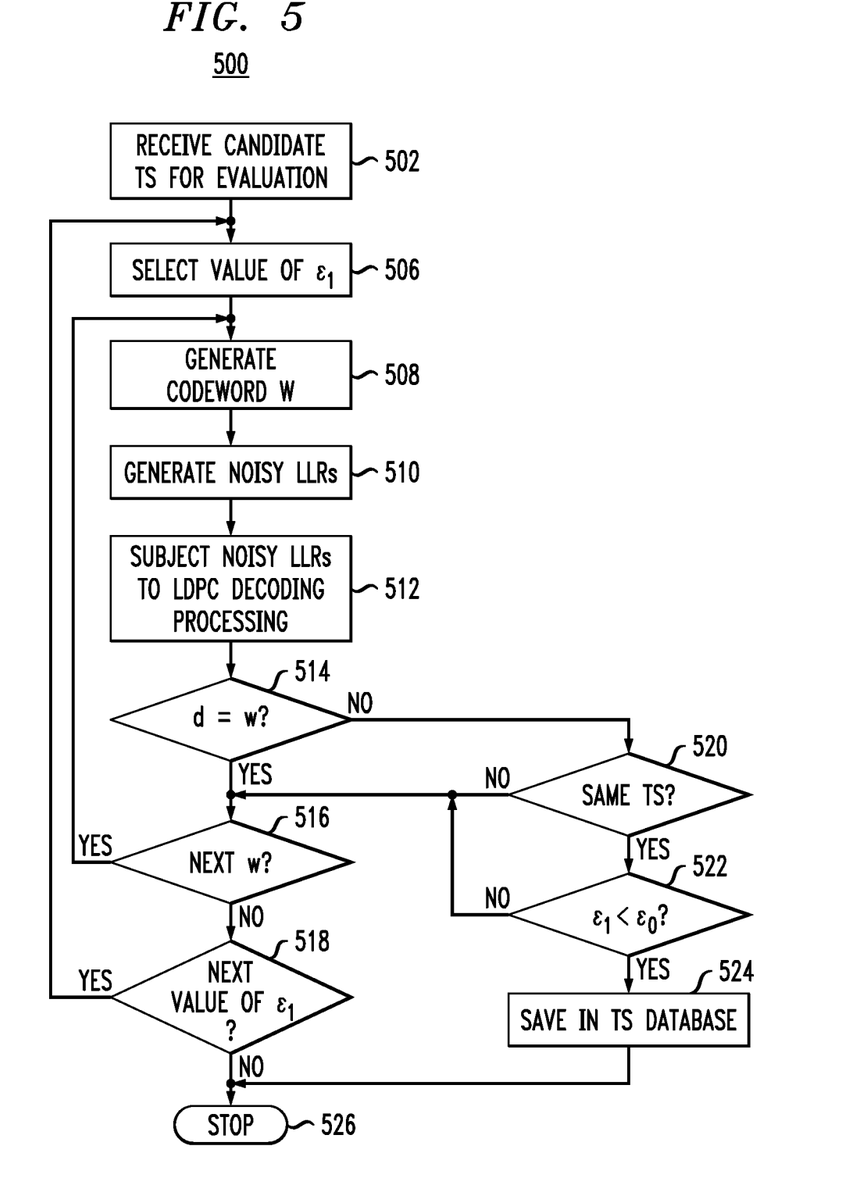
FIG. 5 shows a flowchart of a method of evaluating new trapping sets that can be used in conjunction with the method shown in FIG. 2 according to an embodiment of the disclosure.

FIG. 5 shows a flowchart of a method 500 of evaluating new trapping sets according to one embodiment of the disclosure. In one embodiment, method 500 can used to implement a TS-stability test mentioned above, e.g., in reference to FIGS. 3 and 4.

At step 502, a candidate trapping set is received for evaluation. For example, the candidate trapping set can be retrieved from the memory where it was saved at step 224 of method 200 (FIG. 2).

At step 506, a level ($\epsilon_1$) of the localized noise component is selected, e.g., in a manner similar to that used at step 206 of method 200. The value of $\epsilon_1$ used at step 506 may or may not be related to the value of $\epsilon$ used at step 206 of the corresponding processing cycle in method 200. Different occurrences of step 506 may use different respective values of $\epsilon_1$, e.g., to enable method 500 to quantify the stability of the candidate trapping set.

At step 508, a codeword (w) is generated, e.g., in a manner similar to that used at step 208 of method 200.

At step 510, a set of noisy LLR values is generated, e.g., in a manner similar to that expressed by Eq. (1), but using $\epsilon_1$ instead of $\epsilon$ and the indicator function $I_k$ corresponding to the candidate trapping set. The distributed noise component, $F_k$, may or may not be zero.

At step 512, the set of noisy LLR values generated at step 510 is subjected to LDPC decoding processing. The LDPC decoding processing is carried out in a conventional manner and is terminated when the decoder converges on a valid codeword or the maximum allowed number of decoding iterations is reached. The hard decision generated by the decoder when the processing is terminated is output word d.

At step 514, output word d generated at step 512 is compared with codeword w generated at step 508. If d=w, then the processing of method 500 is directed to step 516. If d≠w, then the processing is directed to step 522.

Step 516 serves to cycle method 500 through different codewords. If it is desirable to evaluate the stability of the candidate trapping set with respect to another codeword, then the processing is directed back to step 508. Otherwise, the processing is directed to step 518.

Step 518 serves to cycle method 500 through different values of $\epsilon_1$. If it is desirable to evaluate the stability of the candidate trapping set using a different value of $\epsilon_1$, then the processing is directed back to step 506. Otherwise, the processing is directed to step 526, where it is terminated.

At step 520, differences between output word d generated at step 512 and codeword w generated at step 508 are evaluated to determine whether or not output word d contains the candidate trapping set of step 502. If the same candidate trapping set is found in output word d (indicating that the candidate trapping set is a stable trapping set), then the processing of method 500 is directed to step 522. Otherwise, the processing is directed to step 516.

At step 522, the current value of $\epsilon_1$ is compared with a threshold level, $\epsilon_0$. If $\epsilon_1 < \epsilon_0$, then the processing of method 500 is directed to step 524. Otherwise, the processing is directed to step 516.

At step 524, the candidate trapping set is added to the TS database, and the processing of method 500 is directed to step 526, where the processing is terminated. Note that step 522 serves as a filter that causes the TS database to accept only relatively "dangerous" trapping sets, with the current value of $\epsilon_1$ being used as a quantifier of how dangerous the trapping set might be for the LDPC decoder in terms of its influence on BER and error-floor characteristics. One of ordinary skill in the art will appreciate that a stable trapping set characterized by a relatively small value of $\epsilon_1$ is also likely to be a dominant trapping set, because it tends to "attract" the decoder to the corresponding state, thereby increasing the frequency with which this trapping set tends to appear in the output words generated by the failed decoder. For example, the value of $\epsilon_0$ used at step 522 can be an empirical parameter, the selection of which might be influenced, among other things, by the memory volume available for storing the resulting TS database in the corresponding read channel, such as the memory volume of TS-ROM 430 or TS-RAM 440 in DDPP unit 400 (FIG. 4).

Some benefits of methods 200 and 500 derive from the fact that these methods can be implemented as add-ons to other TS-search methods. For example, a paper by Chad A. Cole, Eric K. Hall, Stephen G. Wilson, and Thomas R. Giallorenzi, entitled "A General Method for Finding Low Error Rates of LDPC Codes," submitted for publication to the IEEE on Feb. 1, 2008, and incorporated herein by reference in its entirety, discloses a TS-search method having a step of estimating an error boundary. Methods 200 and 500 can advantageously reuse at least some of the computational results obtained during that step, thereby requiring a relatively small amount of additional computations, while providing a significant benefit of discovering many more trapping sets in addition to those discovered using only the TS-search method of Cole et al.

While this invention has been described with reference to various alternate embodiments, this description is not intended to be construed in a limiting sense.

For example, at least some embodiments are applicable to coding schemes other than LDPC coding.

Although various embodiments have been described in reference to binary codes, at least some embodiments can also be used with non-binary codes. For a non-binary code, the LLR that $w_j = a$, where $a \in GF(q)$, is defined as $\log(P(w_j=a)/P(w_j=0))$. A definition of a non-binary code and more details on the use of non-binary codes in digital-communication and data-storage systems can be found, e.g., in Chapter 3 of W. E. Ryan, S. Lin, "Channel Codes: Classical and Modern," Cambridge University Press, 2009, pp. 121-133, which is incorporated herein by reference in its entirety.

Unless explicitly stated otherwise, each numerical value and range should be interpreted as being approximate as if the word "about" or "approximately" preceded the value of the value or range.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Embodiments of the invention can be manifest in other specific apparatus and/or methods. The described embodiments are to be considered in all respects as illustrative and not restrictive. All changes that come within the meaning and range of equivalency of the claims are to be embraced within their scope.

A person of ordinary skill in the art would readily recognize that steps of various above-described methods can be performed by programmed computers. Herein, some embodiments are intended to cover program storage devices, e.g., digital data storage media, which are machine or computer readable and encode machine-executable or computer-executable programs of instructions where said instructions perform some or all of the steps of methods described herein. The program storage devices may be, e.g., digital memories, magnetic storage media such as magnetic disks or tapes, hard drives, or optically readable digital data storage media. The embodiments are also intended to cover computers programmed to perform said steps of methods described herein.

The description and drawings illustrate embodiments of the invention. Furthermore, all examples recited herein are principally intended expressly to be only for pedagogical purposes to aid the reader in understanding an embodiment of the invention and the concepts contributed by the inventor(s) to furthering the art, and are to be construed as being without limitation to such specifically recited examples and conditions. Moreover, all statements herein reciting embodiments of the invention, as well as specific examples thereof, are intended to encompass equivalents thereof.

The functions of the various elements shown in the figures, including any functional blocks labeled as "processors," may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "computer," "processor," or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included.

It should be appreciated by those of ordinary skill in the art that any block diagrams herein represent conceptual views of circuitry representing one or more embodiments of the invention. Similarly, it will be appreciated that any flowcharts, flow diagrams, state transition diagrams, pseudo code, and the like represent various processes which may be substantially represented in computer readable medium and so executed by a computer or processor, whether or not such computer or processor is explicitly shown.

Although embodiments of the invention have been described herein with reference to the accompanying drawings, it is to be understood that embodiments of the invention are not limited to the described embodiments, and one of ordinary skill in the art will be able to contemplate various other embodiments of the invention within the scope of the following claims.

What is claimed is:

1. A method of generating trapping-set information for use in decoding encoded codewords, the method comprising:
   (A) selecting a first trapping set from a trapping-set database;
   (B) selecting a first codeword;
   (C) using a noise injector circuit to generate a first set of log-likelihood-ratio values by injecting noise into a set of bit positions of the first codeword, wherein the set of bit positions corresponds to the first trapping set;
   (D) generating a first output word by subjecting the first set of log-likelihood-ratio values to decoding processing; and
   (E) when the first output word is not a valid codeword, comparing the first output word and the first codeword to detect a second trapping set different from the first trapping set.

2. The method of claim 1, further comprising:
   (F) updating the trapping-set database by including therein the second trapping set after verifying that the second trapping set is not present in the trapping-set database.

3. The trapping-set database generated using the method of claim 2.

4. A device comprising a memory coupled to a read channel, wherein:
   said memory is configured to store therein the trapping-set database; and
   the device is configured to use the trapping-set database for decoding processing of a read signal received by the read channel.

5. The method of claim 2, further comprising storing the trapping-set database in a memory coupled to a read channel to enable the read channel to use the trapping-set database for decoding processing of a read signal received by the read channel.

6. The method of claim 2, wherein the method is implemented in a read channel configured to use the trapping-set database for decoding processing of a read signal received by the read channel.

7. The method of claim 6, wherein the method is implemented during the read-channel's idle time.

8. The method of claim 2, wherein steps (A)-(F) are performed using a read-channel simulator.

9. The method of claim 8, further comprising:
   loading the trapping-set database into a memory coupled to a read channel and configured to provide trapping-set information for decoding processing of a read signal received by the read channel.

10. The method of claim 9, wherein said loading is performed at a read-channel production facility prior to the read channel being shipped to a customer.

11. The method of claim 1, further comprising determining whether or not to add the second trapping set to the trapping-set database by subjecting the second trapping set to a stability test.

12. The method of claim 11, wherein:
    the step of determining comprises determining whether the second trapping set is stable or unstable; and
    the method further comprises:
    if the second trapping set is stable, then adding the second trapping set to the trapping-set database; and
    if the second trapping set is unstable, then not adding the second trapping set to the trapping-set database.

13. The method of claim 11, wherein the step of determining further comprises:
    selecting a second codeword;
    generating a second set of log-likelihood-ratio values corresponding to the second codeword by injecting noise into a set of bit positions of the second codeword, wherein the set of bit positions corresponds to the second trapping set;
    generating a second output word by subjecting the second set of log-likelihood-ratio values to decoding processing; and
    when the second output word is not a valid codeword, determining whether or not the second output word has the second trapping set.

14. The method of claim 13, further comprising:
    selecting a level of noise for the noise injected into the set of bit positions of the second codeword;
    when the second codeword has the second trapping set, comparing said level with a threshold value;
    if said level is lower than the threshold value, then adding information about the second trapping set to the trapping-set database; and
    if said level is higher than the threshold value, then not adding the information about the second trapping set to the trapping-set database.

15. The method of claim 13, further comprising selecting a level of noise, wherein the noise injected into the set of bit positions of the second codeword, wherein said injecting noise into the set of bit positions of the second codeword comprises:
    for each bit position in said set of bit positions of the second codeword, changing, by an amount proportional to said level, a respective confidence value expressed by confidence bits in a respective log-likelihood-ratio value.

16. The method of claim 15, further comprising changing said level.

17. The method of claim 13, wherein the second codeword is the same as the first codeword.

18. The method of claim 1, further comprising repeating steps (A)-(E) for at least one of: a different first trapping set and a different first codeword.

19. A non-transitory machine-readable medium, having encoded thereon program code, wherein, when the program code is executed by a machine, the machine implements a method of generating trapping-set information for use in decoding encoded codewords, the method comprising:
- (A) selecting a first trapping set from a trapping-set database;
- (B) selecting a first codeword;
- (C) generating a first set of log-likelihood-ratio values by injecting noise into a set of bit positions of the first codeword, wherein the set of bit positions corresponds to the first trapping set;
- (D) generating a first output word by subjecting the first set of log-likelihood-ratio values to decoding processing; and
- (E) when the first output word is not a valid codeword, comparing the first output word and the first codeword to detect a second trapping set different from the first trapping set.

20. A communication system, comprising:
a decoder;
a processor operatively coupled to the decoder;
a memory operatively coupled to the processor and configured to store a trapping-set database;
a trapping-set filter operatively coupled to the processor and the memory; and
a noise injector operatively coupled to the processor and the decoder, wherein:
the processor is configured to select a first trapping set from the trapping-set database stored in the memory;
the noise injector is configured to:
 receive a first codeword; and
 generate a first set of log-likelihood-ratio values corresponding to the first codeword by injecting noise into a set of bit positions of the first codeword corresponding to the first trapping set selected by the processor;
the decoder is configured to generate a first output word by subjecting the first set of log-likelihood-ratio values to decoding processing;
when the first output word is not a valid codeword, the processor is further configured to compare the first output word and the first codeword to detect a second trapping set; and
the trapping-set filter is configured to update the trapping-set database by adding thereto the second trapping set when the second trapping set is not present in the trapping-set database.

* * * * *